United States Patent
Kim et al.

(10) Patent No.: US 10,700,816 B2
(45) Date of Patent: Jun. 30, 2020

(54) METHOD FOR PERFORMING HARQ USING POLAR CODE

(71) Applicant: LG ELECTRONICS INC., Seoul (KR)

(72) Inventors: Il-Min Kim, Seoul (KR); Joonkui Ahn, Seoul (KR); Byounghoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/323,512

(22) PCT Filed: Aug. 9, 2017

(86) PCT No.: PCT/KR2017/008648
§ 371 (c)(1),
(2) Date: Feb. 5, 2019

(87) PCT Pub. No.: WO2018/030794
PCT Pub. Date: Feb. 15, 2018

(65) Prior Publication Data
US 2019/0199480 A1    Jun. 27, 2019

Related U.S. Application Data

(60) Provisional application No. 62/372,369, filed on Aug. 9, 2016.

(51) Int. Cl.
*H04L 1/08* (2006.01)
*H03M 13/00* (2006.01)
(Continued)

(52) U.S. Cl.
CPC ............. *H04L 1/08* (2013.01); *H03M 13/13* (2013.01); *H03M 13/616* (2013.01);
(Continued)

(58) Field of Classification Search
CPC ....... H04L 1/0045; H04L 1/0041; H04L 1/18; H04L 1/00; H04L 1/0068; H04L 1/08;
(Continued)

(56) References Cited

U.S. PATENT DOCUMENTS 6,314,289 B1 * 11/2001 Eberlein .............. H04B 7/0604
375/225
2014/0108748 A1   4/2014 Lee et al.
(Continued)

FOREIGN PATENT DOCUMENTS

WO    2015026148    2/2015

OTHER PUBLICATIONS

PCT International Application No. PCT/KR2017/008648, International Search Report dated Nov. 16, 2017, 4 pages.
(Continued)

*Primary Examiner* — Guy J Lamarre
(74) *Attorney, Agent, or Firm* — Lee, Hong, Degerman, Kang & Waimey PC

(57) ABSTRACT

Provided are a method and an apparatus for performing a HARQ based on a polar code in a wireless communication system. The apparatus transmits multiple first output bits, which are generated from multiple first input bits, to a receiver. Upon receiving a retransmission request, the apparatus generates multiple second output bits from multiple second input bits. The apparatus selects multiple third output bits from among the multiple second output bits, and transmits the selected multiple third output bits to the receiver. Bits, which are encoded differently from the multiple first output bits among the multiple second output bits, are preferentially selected as the multiple third output bits.

15 Claims, 21 Drawing Sheets

(51) Int. Cl.
*H04L 1/00* (2006.01)
*H04L 1/18* (2006.01)
*H03M 13/13* (2006.01)

(52) U.S. Cl.
CPC ... *H03M 13/6306* (2013.01); *H03M 13/6362* (2013.01); *H04L 1/00* (2013.01); *H04L 1/0041* (2013.01); *H04L 1/0045* (2013.01); *H04L 1/0057* (2013.01); *H04L 1/0058* (2013.01); *H04L 1/18* (2013.01); *H04L 1/0068* (2013.01)

(58) Field of Classification Search
CPC ... H04L 1/1819; H04L 1/0058; H04L 1/0057; H03M 13/616; H03M 13/6362; H03M 13/6306; H03M 13/13
See application file for complete search history.

(56) References Cited

U.S. PATENT DOCUMENTS

| | | | |
|---|---|---|---|
| 2016/0037453 A1* | 2/2016 | Sivanadyan | H04W 52/0235 370/329 |
| 2018/0034593 A1* | 2/2018 | Xu | H04L 1/0011 |
| 2018/0175976 A1* | 6/2018 | Kim | H04L 1/0057 |
| 2019/0028241 A1* | 1/2019 | Ahn | H03M 13/6306 |

OTHER PUBLICATIONS

Chen, K. et al., "Polar Coded HARQ Scheme with Chase Combining," Cornell University Library, arXiv:1310.6650v2 [cs.1-1], Jan. 2014, 8 pages.

Hong, S. et al., "Capacity-Achieving Rate-Compatible Polar Codes," Cornell University Library, arXiv: 1510.01776v2 [cs.1-1], Jan. 2016, 13 pages.

El-Khamy, M. et al., "Rate-Compatible Polar Codes for Wireless Channels," Cornell University Library, arXiv:1508.07698v1 [cs.1-IT], Aug. 2015, 8 pages.

\* cited by examiner

ñ columns, form which
n columns are selected n columns to be compared

METHOD FOR PERFORMING HARQ USING POLAR CODE

CROSS-REFERENCE TO RELATED APPLICATIONS

This application is the National Stage filing under 35 U.S.C. 371 of International Application No. PCT/KR2017/008648, filed on Aug. 9, 2017, which claims the benefit of U.S. Provisional Application No. 62/372,369, filed on Aug. 9, 2016, the contents of which are all hereby incorporated by reference herein in their entirety.

BACKGROUND OF THE INVENTION

Field of the Invention

The present invention relates to wireless communications. More particularly, the present invention relates to a method for performing HARQ using polar codes.

Related Art

It is important to transfer data without error from a transmitter to a receiver in a data communication system. In 1948, Shannon mathematically investigated a limitation of a maximum data transfer rate at which data can be transferred without error, which is called channel capacity. In order to implement a real communication system close to the channel capacity, an error correction code having implementable complexity must exist. Several types of error correction codes have been developed since 1948, and turbo codes and low density parity check (LDPC) or the like have been developed relatively recently as error correction codes which exhibit performance close to channel capacity of Shannon. However, although these codes exhibit performance close to the channel capacity of Shannon, accurate channel capacity is not achieved. A polar code has recently been developed as a code which completely satisfies the channel capacity mathematically while satisfying such a problem.

Hybrid Automatic Repeat request (HARQ) corresponds to a technique that can recover an error by requesting a retransmission, when a packet having an error is receiver. Various studies have been conducted on a polar coding-based HARQ scheme which combines polar coding and HARQ. However, according to the schemes proposed up to now, the polar code has not been constructed to improve information of channel polarization which is basic concept of polar coding.

SUMMARY OF THE INVENTION

Technical Objects

This specification provides a method and apparatus for performing HARQ based on a polar code in a wireless communication system.

Technical Solutions

According to an aspect, provided herein is a method for performing a Hybrid Automatic Repeat reQuest (HARQ) based on a polar code. The method may include the steps of acquiring, by a transmitter, a plurality of first input bits being inputted to a first encoder from a plurality of mother bits having at least one information bit and at least one frozen bit, transmitting, by the transmitter, a plurality of first output bits being generated from the first input bits by the first encoder to a receiver, receiving, by the transmitter, a re-transmission request for the plurality of mother bits from the receiver, acquiring, by the transmitter, a plurality of second input bits being inputted to a second encoder from the plurality of mother bits, generating, by the transmitter, a plurality of second output bits being generated from the second input bits by the second encoder, selecting, by the transmitter, a plurality of third output bits from the plurality of second output bits, transmitting, by the transmitter, the plurality of third output bits to the receiver.

The plurality of second input bits may include at least one information bit being included in the plurality of first input bits.

Among the plurality of second output bits, bits being encoded differently from the plurality of first input bits may be preferentially selected as the third output bits.

According to another aspect, provided herein is a device for performing a Hybrid Automatic Repeat request (HARQ) based on a polar code, which includes a radio frequency (RF) unit transmitting and receiving radio signals, and a processor controlling the RF unit and including a first encoder and a second encoder. The processor may be configured to acquire a plurality of first input bits being inputted to a first encoder from a plurality of mother bits having at least one information bit and at least one frozen bit, to transmit a plurality of first output bits being generated from the first input bits by the first encoder to a receiver, to receive a re-transmission request for the plurality of mother bits from the receiver, to acquire a plurality of second input bits being inputted to a second encoder from the plurality of mother bits, to generate a plurality of second output bits being generated from the second input bits by the second encoder, to select a plurality of third output bits from the plurality of second output bits, and to transmit the plurality of third output bits to the receiver.

Effects of the Invention

While performing the HARQ, the error likelihood may be reduced, and the number of re-transmission sessions may be reduced. Additionally, diverse polar codes having reduced calculation (or computation) are proposed to best fit the computing power of a device (or apparatus).

DESCRIPTION OF EXEMPLARY EMBODIMENTS

Figure 1:
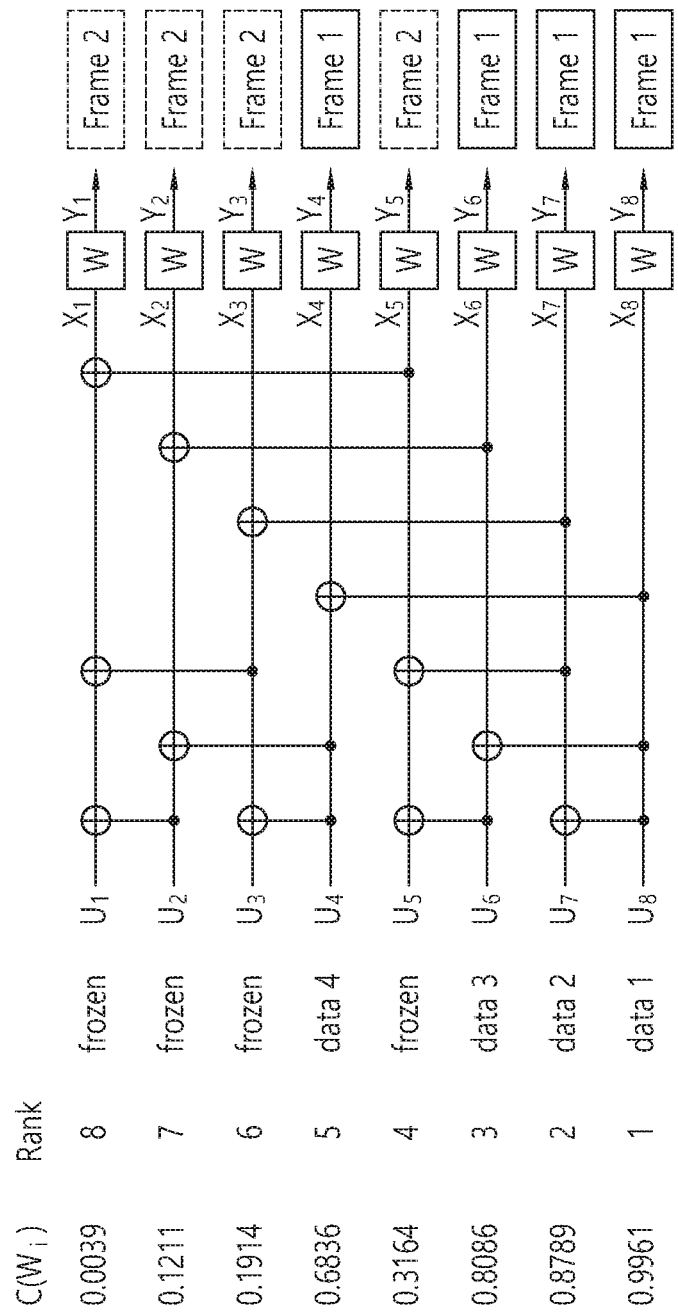
FIG. 1 illustrates an example of Method 1.

The most essential object of digital communication is to transmit information that is configured of digital bits from a transmitting end to a receiving end as fast as possible without any error. The two main methods that can be used in order to perform such error-free transmission of information correspond to an Automatic Repeat Request (ARQ) method and an error correction code method. Firstly, the ARQ method operates as described below. When a transmitting end initially transmits an information packet, a cyclic redundancy check (CRC) is included in the transmitted information packet. Thereafter, a receiving end checks whether or not an error exists in the received packet through the CRC, and, then, the receiving end notifies the checked result to the transmitting end through a feedback channel. If the transmitting end is notified by the receiving end that the packet previously transmitted by the transmitting end has been received without error, the transmitting end newly transmits a next packet. Conversely, if the transmitting end is notified that an error has occurred in the previously transmitted packet, the transmitting end re-transmits the previously transmitted packet in which the error has occurred.

The other main method that is used for overcoming errors occurring in a channel corresponds to the error correction code method. An error correction code that can achieve a channel capacity for a binary input/output channel has been developed very recently, and such error correction code is referred to as a polar code. If a polar code is used, channel polarization occurs. And, as a result, only two types of bit channels exist. Bit channels belonging to a first group have excellent quality (i.e., error hardly occurs), and bit channels belonging to a remaining group have very poor quality (i.e., error almost always occurs). In polar coding, information bits are transmitted through the bit channels having excellent quality, and bits that have been notified in advance to the transmitting/receiving ends are transmitted through the bit channels having very poor quality. Herein, such bits that have been notified in advance are referred to as frozen bits. As described above, a process of differentiating bits channels having excellent quality from bit channels having very poor quality and allocating information bits only to positions located in the bit channels having excellent quality is referred to as an optimal information bit allocation.

An HARQ method corresponds to a combination of the ARQ method and the error correction code method. Various types of HARQ methods exist in accordance with the error correction code that is used. The HARQ method that is considered in the present invention corresponds to a polar code based HARQ method consisting of a combination of a polar code that is known to achieve channel capacity and ARQ. In case of implementing the polar code based HARQ, at first, a mother code having a low transmission rate is configured. Thereafter, the mother code is punctured so as to configure multiple packets, and, then, the packets are transmitted one packet at a time. At this point, two different methods exist depending upon whether puncturing is to be performed after performing an optimal information bit allocation for the mother code or whether puncturing is performed on the mother code and then optimal information bits are allocated for a first packet afterwards. Hereinafter, the first method will be referred to as Method 1, and the second method will be referred to as Method 2.

Figure 2:
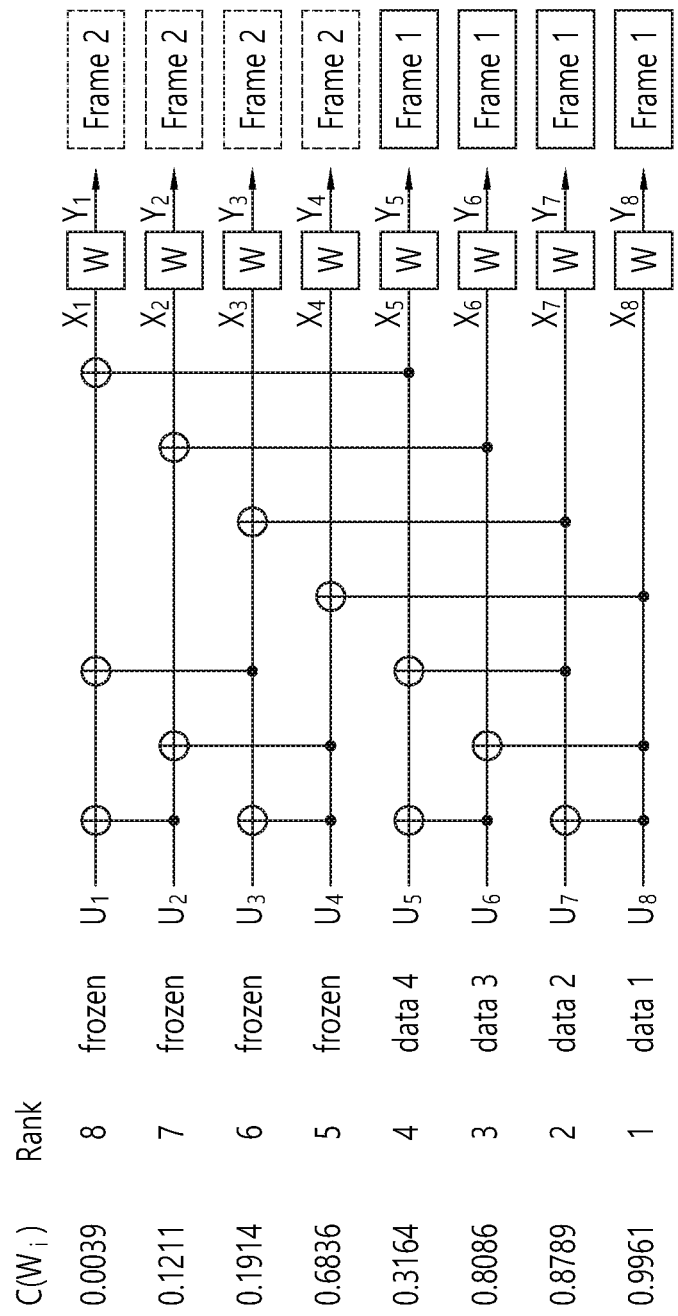
FIG. 2 illustrates an example of Method 2.

FIG. 1 illustrates an example of Method 1. And, FIG. 2 illustrates an example of Method 2. Referring to FIG. 1 and FIG. 2, $C(W_i)$ indicates a channel capacity for an $i^{th}$ bit channel. W indicates a physical channel. $U_i$ indicates input bits, and information bits or frozen bits are used herein. $X_i$ indicates coded bits, and such coded bits are transmitted through the physical channel W. And, $Y_i$ indicates a signal that is received by the receiving end.

In Method 1, an optimal information bit allocation for a length-8 mother code is first executed. In this case, information bits are allocated for 4 bit channels each having a large channel capacity $C(W_i)$, and frozen bits are allocated to the remaining bit channels. More specifically, information bits are allocated for $U_8$, $U_7$, $U_6$, and $U_4$, and frozen bits are allocated for the remaining 4 input bits. Thereafter, puncturing is performed for the 4 bit channels, thereby generating a first packet. In the HARQ, since all of the information bits that are transmitted shall be included in the first packet, the first packet is configured to include $(U_8, Y_8)$, $(U_7, Y_7)$, $(U_6, Y_6)$, and $(U_4, Y_4)$.

In Method 2, puncturing is first performed without any allocation of the information bits. The method of obtaining an optimal polar code by puncturing 4 bits in the length-8 mother code punctures the last 4 bits. More specifically, the first packet is given as $(U_8, Y_8)$, $(U_7, Y_7)$, $(U_6, Y_6)$, and $(U_5, Y_5)$. Thereafter, the optimal information bit allocation is performed on the first packet. In the example given in FIG. 2, since 4 information bits are allocated, information bits are allocated for all of the first packet. In other words, information bits are allocated for $U_8$, $U_7$, $U_6$, and $U_5$, and frozen bits are allocated for the remaining 4 input bits.

Each of Method 1 and Method 2 has its advantages and disadvantages. According to Method 1, when transmitting multiple packets that are generated by puncturing the mother code, in a case where a large number of packets are transmitted and such transmitted packets are combined (or aggregated) in the receiving end and then decoded, its performance becomes nearly optimal. However, since the allocation of the information bits has been optimized in light of the mother code and not the initial packet, for the initial packet or the earlier packets, the performance becomes less optimal. Additionally, since information bits have already been allocated for the mother code, when performing puncturing in order to obtain multiple packets, since a condition necessarily requiring the information bits, which were allocated in advance, to be included should be satisfied, it is difficult to obtain an optimal packet by performing optimal puncturing. For example, when referring to Method 1 of FIG. 1, information bits are first allocated to optimal positions for a length-8 mother code. Then, in order to obtain a first packet, 4 input/output bits are punctured, thereby obtaining the first packet. However, due to the condition requiring the first packet to necessarily include the already given 4 information bits, an optimal polar code packet having a length of 4 cannot be obtained. As described above, the length-4 optimal polar code packet should correspond to a packet that includes the last 4 input/output bits.

Method 2 has advantages and disadvantages that are opposite to those of Method 1. Method 2 is advantageous in that, since the optimization of the information bit allocated is carried out for the first packet, optimal performance may be ensured when transmitting the first packet. Additionally, when performing puncturing for obtaining the first packet, since information bits are not allocated in advance for the mother code, optimal puncturing may be performed. For example, referring to the case of Method 2 shown in FIG. 2, the first packet corresponds to a packet that includes the last 4 input/output bits, and this corresponds to a packet having the optimal length of 4. However, Method 2 is disadvantageous in that, since the optimization of the information bit allocation is carried out for the first packet, as a larger number of packets are transmitted, i.e., as the mother code becomes closer, the information bit allocation is spaced further apart from the optimal position. Therefore, although Method 2 shows an excellent performance at the beginning, as a larger number of packets are being transmitted, the performance of Method 2 becomes less optimal.

Hereinafter, a method that is proposed in order to resolve the disadvantages of Method 1 and Method 2 will be described in detail. Firstly, in order to resolve the disadvantages (or problems) of Method 1 and Method 2 at the same time, a method wherein the allocation of the information bit is excellent for the first packet as well as for the subsequent packet is proposed. Secondly, a method having an optimal tradeoff in light of a decoding error likelihood and transmission efficiency is proposed. And, thirdly, a method having a suboptimal tradeoff in light of a decoding error likelihood having a reduced level of complexity and transmission efficiency is proposed.

Section 1: 'Method 3', a Method in which Information Bit Allocation for Both First Packet and Second Packet is Optimal In order to simplify the discussions on the method proposed in the present invention, a case where the mother code is punctured and divided into only two packets (a first packet and a second packet) will be considered herein. In an actual HARQ, the mother code may be punctured to two or more packets. However, the discussion on such case will be made later on in Section 3. In this section (Section 1) and Section 2, only the case where the mother code is configured of two packets will be considered.

The method that is first proposed in this section will be referred to as Method 3, and the object of this method is to allow the allocation of the information bits to be optimal for both the first packet and the second packet.

Hereinafter, the mother code (or mother bit sequence) includes a plurality of mother bits. The plurality of mother bits includes at least one information bit and at least one frozen bit. A mother encoder is used for encoding the mother code. An encoder that is used during an initial transmission of the HARQ is referred to as a first encoder, and an encoder that is used during a re-transmission of the HARQ is referred to as a second encoder. The first encoder is obtained by puncturing the mother encoder, and the second encoder corresponds to the mother encoder itself, or the second encoder is obtained by puncturing the mother encoder. Bits being inputted to each encoder are referred to as input bits, and bits being inputted to each encoder are referred to as output bits.

Firstly, the first packet (input bits of the first encoder) is configured by puncturing the mother code without performing any allocation of the information bits, and, then, information bits are optimally allocated for the first packet. Thereafter, when transmitting the second packet, the object of the present invention is to allocate optimal information bits. In order to do so, information bits are also optimally allocated for the second packet (input bits of the second encoder). Afterwards, among the reception signals of the first packet, only the signals that can be immediately re-used by the receiving end may be used for decoding the mother code. At this point, the remaining signals that are additionally needed are re-transmitted by the transmitting end. Hereinafter, the signals that can be immediately re-used and the remaining signals that are additionally needed are defined as described below.

For example, it will be given that a length-8 mother code is considered, and that the mother encoder uses a generator matrix $G_8$, which is shown below.

$$G_8 = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{[Equation 1]}$$

When input signals for the mother code are given as $U'=[U_1', U_2', \ldots, U_8']$, the coded signals $X'=[X_1', X_2', \ldots, X_8']$ are given as shown below.

$$X' = U'G_8 \quad \text{[Equation 2]}$$

Signals that are received when X' is transmitted through channel W are given as $Y'=[Y_1', Y_2', \ldots, Y_8']$. Then, by selecting (i.e., by puncturing) a 4×4 matrix corresponding to a lower right portion of $G_8$, a generator matrix $G_4$ of a length-4 polar code is obtained as shown below. The first encoder uses a generator matrix $G_4$.

$$G_4 = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \quad \text{[Equation 3]}$$

When input signals for the first packet are given as $U=[U_1, U_2, U_3, U_4]$, the coded signals $X=[X_1, X_2, X_3, X_4]$ are given as shown below.

$$X = UG_4 \quad \text{[Equation 4]}$$

Signals that are being received when X is transmitted through channel W are referred to as $Y=[Y_1, Y_2, Y_3, Y_4]$. In Method 3, which is proposed in the present invention, optimal information bit allocation is performed on U' and U. In a case where 4 information bits are allocated, the optimal method is as shown below.

$$U=[d_1,d_2,d_3,d_4]$$

$$U'=[0,0,0,d_1,0,d_2,d_3,d_4]. \quad \text{[Equation 5]}$$

After allocating the above-described information bits, X' and X are calculated by $X=U'G_8$ and $X=UG_4$. Thereafter, comparison is made between $X_5'$ and $X_1$, so as to determine whether $X_5'$ and $X_1$ are equal to or different from one another. Similarly, comparison is made between $X_6'$ and $X_2$, $X_7'$ and $X_3$, and $X_8'$ and $X_4$. The reason for performing such comparison is because $G_4$ is obtained by puncturing the lower right 4×4 portion of $G_8$. If $X_5'=X_1$, $Y_5'=Y_1$ may be used, and, herein, $Y_1$ of the first packet corresponds to a signal that can be re-used in the mother code. If $X_5' \neq X_1$, $Y_1$ of the first packet corresponds to a signal that cannot be re-used in the mother code. By using the above-described method, it may be determined whether or not $Y_2, Y_3$, and $Y_4$ are signals that can be re-used. In a case where the given U' and U' are used, $Y_1$ is given as a signal that cannot be re-used, and $Y_2, Y_3$, and $Y_4$ are given as signals that can be re-used. In this case, $Y_2, Y_3$, and $Y_4$ are respectively used as $Y_6', Y_7'$, and $Y_8'$ of the mother code. Signals that are additionally needed in order to decode the mother code correspond to $Y_1', Y_2', Y_3', Y_4'$, and $Y_5'$. Therefore, in the second packet, the transmitter transmits $X_1', X_2', X_3', X_4'$, and $X_5'$.

Figure 3:
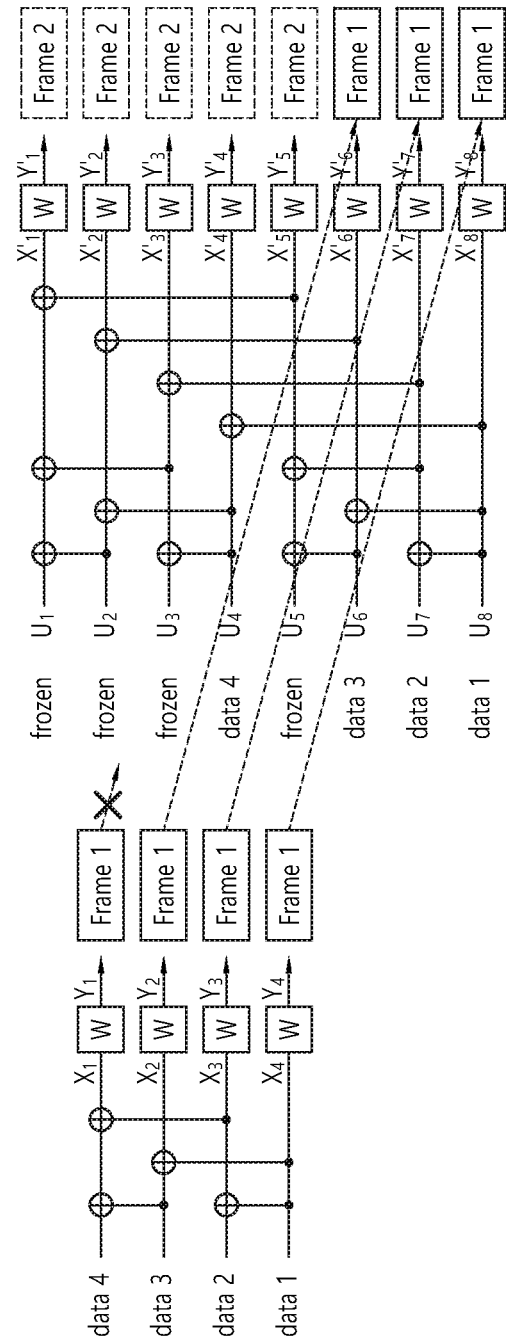
FIG. 3 illustrates an example of Method 3.

FIG. 3 illustrates an example of Method 3.

In the first packet, after coding 4 information bits data 1, data 2, data 3, and data 4 by using the length-4 polar code, the coded bits $Y_1, Y_2, Y_3$, and $Y_4$ are transmitted. In case the receiving end decodes such packets without any error, an ACK is transmitted, and, in case error occurs during the decoding process, a NACK is transmitted. In case the transmitting end receives the NACK through a feedback channel, the transmitting end performs re-transmission of the mother code.

In order to perform the re-transmission, 4 information bits are inputted to the second encoder in positions where the channel capacity or the decoding reliability is maximized. In case 4 information bits are transmitted by a length-8 polar code, the optimal bit positions are $U_4, U_6, U_7$, and $U_8$. Then, 0, which corresponds to a frozen bit, is allocated to each of the remaining 4 input bit positions. When a comparison is made between the signals that are received in the first packet $Y_1, Y_2, Y_3$, and $Y_4$ and the signals that are received in the second packet $Y_1', Y_2', Y_3', Y_4', Y_5', Y_6', Y_7'$, and $Y_8'$, it will be apparent that $Y_2=Y_6'$, $Y_3=Y_7'$, and $Y_4=Y_8'$. Therefore, even if the receiver does not receive the last three signals of the second packet, the receive may re-use the previously received reception signals of the first packet. In order to perform decoding of the length-8 polar code, the receiver needs the remaining 5 reception signals $Y_1', Y_2', Y_3', Y_4'$, and $Y_5'$. For this, the transmitter transmits the 5 coded bits $X_1, X_2, X_3, X_4$, and $X_5$.

When transmitting the second packet, bits that are encoded by using the same method as the first packet are preferentially excluded from the second packet. Bits that are encoded by using a method being different from the first packet are preferentially allocated to the second packet. Based on the above-described generator matrix, the encoding process refers to a process of performing an XOR calculation on the input bits of the encoder.

A method of preferentially selecting, among the plurality of second output bits, bits being processed with XOR operation that are different from the plurality of first bits or bits being processed with a number of XOR operations that is different from the plurality of first bits. Herein, it is given that, among the output bits of the second encoder, the output bits of the first encoder are the same as the bits being processed with the XOR operation, and that the bits being processed with the same number of XOR operations have been identically encoded. Herein, it is also given that, among the output bits of the second encoder, the output bits of the first encoder are not the same as the bits being processed with the XOR operation, or that the bits being processed with the different number of XOR operations have been differently encoded.

Hereinafter, a comparison will be made between Method 3 of FIG. 3 and Method 1 of FIG. 1. Although Method 1 is disadvantageous in that the polar code in the first packet does not correspond to the optimal length-4 polar code, in Method 3, the optimal length-4 polar code is configured in the viewpoint of the first packet. Additionally, in the viewpoint of the mother code corresponding to after the transmission of the second packet, in light of the characteristic of information bits being optimally allocated, Method 1 and Method 3 are the same. A comparison between Method 3 and Method 2 will be made as described below. Both Method 2 and Method 3 configure an optimal length-4 mother code in the viewpoint of the first packet. Additionally, although Method 2 is disadvantageous in that information bits are not optimally allocated in the viewpoint of the mother code corresponding to after the transmission of the second packet, in Method 3, the information bits are optimally allocated also in the viewpoint of the mother code.

As described above, Method 3 has both the advantages of Method 1 and the advantages of Method 2. However, Method 3 is disadvantageous in that a larger number of coded bits need to be transmitted from the second packet. For example, in Method 1 of FIG. 1 and Method 2 of FIG. 2, only 4 coded bits needed to be transmitted from the second packet, whereas, in Method 3 of FIG. 3, 5 coded bits are transmitted from the second packet. This is because, in Method 3, among the 4 received signals of the first packet, the second packet is re-used in only 3 signals. In the present invention, a ratio of the packets that are re-used is referred to as efficiency, and, in the example of FIG. 3, the efficiency is given as f=75%.

Figure 4:
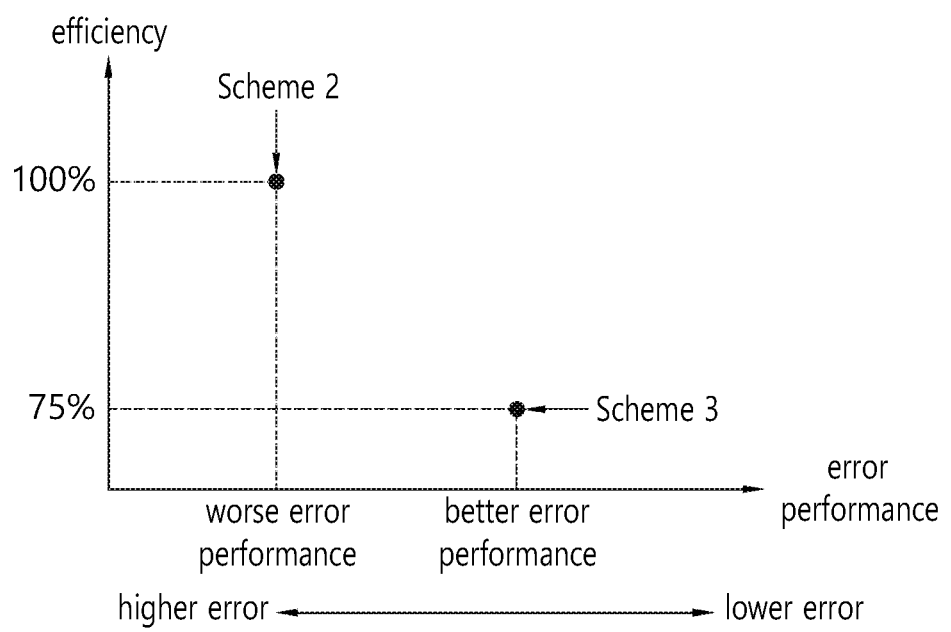
FIG. 4 is a graph showing a comparison between Method 2 and Method 3 in light of performance and efficiency.

FIG. 4 is a graph showing a comparison between Method 2 and Method 3 in light of performance and efficiency. In Method 2, since all 4 received signals of the first packet are re-used, Method 2 has a maximum efficiency of 100%, in the viewpoint of the mother code corresponding to after the transmission of the second packet, since the bit allocation does not correspond to the optimal bit allocation, the performance is degraded. On the other hand, in Method 3, although the efficiency marks a low level of 75%, since the bit allocation is optimal in the viewpoints of both the first packet and the mother code, maximum efficiency is achieved. In the above-described example, a simple case where the first packet is configured of 4 bits and the mother code is configured of 8 bits has been considered. Therefore, a value that may be given as the efficiency level is equal to one of 100%, 75%, 50%, 25%, and 0%. If the length of the first packet and the length of the mother code become longer, the variation in the values that may be given as the efficiency level may become more consecutive.

Figure 5:
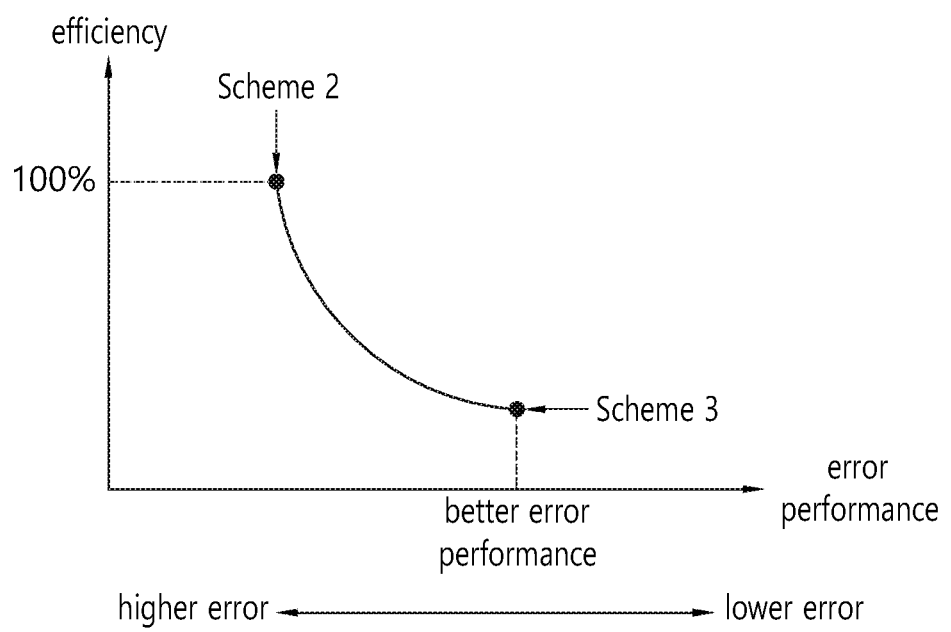
FIG. 5 is a graph consecutively showing tradeoff relations between performance and efficiency in Method 2 and Method 3.

FIG. 5 is a graph consecutively showing tradeoff relations between performance and efficiency in Method 2 and Method 3. Each of Method 2 and Method 3 has a tradeoff that is consecutively shown between performance and efficiency.

Section 2: An Optimal Transmission Method Having an Optimal Tradeoff in Light of Efficiency and Error Performance In the previous section, Method 3 was proposed, and this was compared with Method 2. Each of Method 2 and Method 3 has a tradeoff in light of error performance and efficiency. And, proposed herein is a method for enhancing such tradeoff.

2.1. An Optimal Transmission Method in a Case where the Mother Code has a Length of 8

By reconsidering the case where a length-4 first packet is obtained by puncturing the length-8 mother code, which was considered in Section 1, an optimal method having optimal performance in light of both efficiency and error likelihood is proposed herein.

Figure 6:
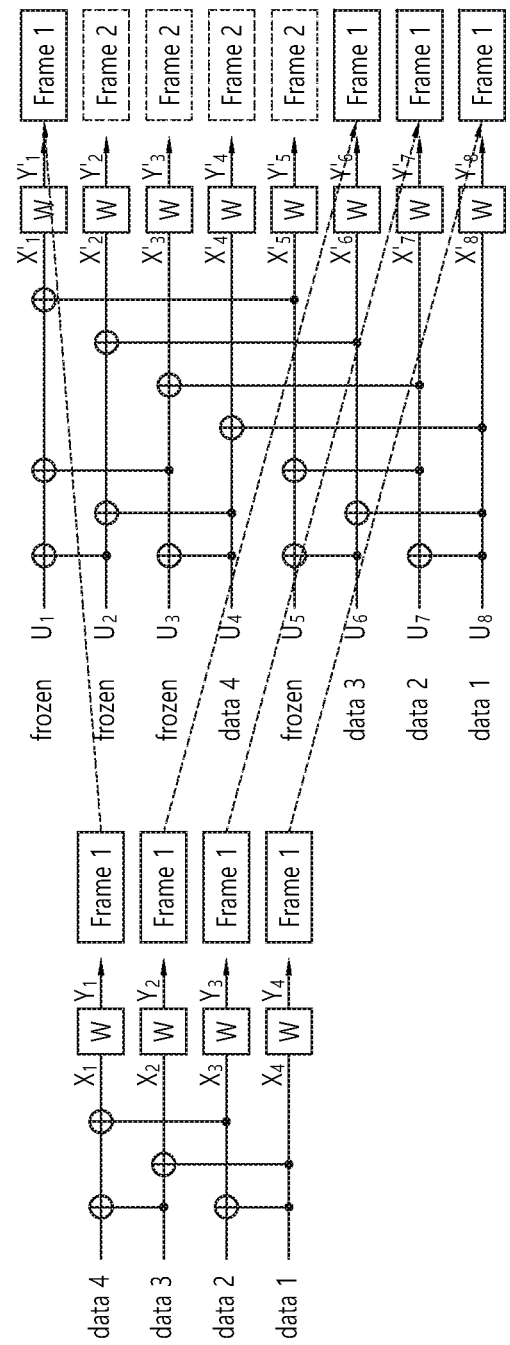
FIG. 6 illustrates a method having optimal performance and efficiency.

FIG. 6 illustrates a method having optimal performance and efficiency. In this method, the most important idea is to use the equation of $X_1=X_1'$ (eventually $Y_1=Y_1'$).

This may be verified (or checked) as described below. In the first packet, it is given that $X_1$=data 1+data 2+data 3+data 4. Herein, '+' corresponds to a modulo 2 arithmetic. In the second packet, it is given that $X_1'$=U1+U2+U3+U4+U5+U6+U7+U8. Herein, however, since each of U1, U2, U3, and U5 corresponds to a frozen bit 0, it will be given that $X_1'$=U4+U6+U7+U8=data 1+data 2+data 3+data 4.

The reason for the above-described equation may be indicated in the form of an equation by using a generator matrix G of a polar code. In the optimal method, the generator matrix $G_4$ of the length-4 polar code corresponding to the first packet and the generator matrix $G_8$ of the length-8 polar code corresponding to the mother code are given as described in the previous section. Additionally, a coded bit vector X of the first packet and a coded vector X' of the mother code are given as shown below.

$$X=[X_1,X_2,X_3,X_4]=UG_4$$

$$X'=[X_1',X_2',X_3',X_4',X_5',X_6',X_7',X_8']=U'G_8 \qquad \text{[Equation 6]}$$

Herein, however, U and U' indicate source information bit vectors for the first packet and the mother code as shown below.

$$U=[U_1,U_2,U_3,U_4]$$

$$U'=[U_1',U_2',U_3',U_4',U_5',U_6',U_7',U_8']. \qquad \text{[Equation 7]}$$

In a case where 4 information bits are transmitted, the optimal bit allocation is given as shown below.

$$U=[d_1,d_2,d_3,d_4]$$

$$U'=[0,0,0,d_1,0,d_2,d_3,d_4]. \qquad \text{[Equation 8]}$$

As a result, the coded bit vectors are given as shown below.

$$\begin{aligned}
X &= [X_1, X_2, X_3, X_4] = UG_4 \qquad \text{[Equation 9]} \\
&= [d_1 + d_2 + d_3 + d_4, d_2 + d_4, d_3 + d_4, d_4] \\
X' &= [X_1', X_2', X_3', X_4', X_5', X_6', X_7', X_8'] = U'G_8 \\
&= [d_1 + d_2 + d_3 + d_4, d_1 + d_2 + d_4, d_1 + d_3 + d_4, \\
&\quad d_2 + d_3 + d_4, d_2 + d_4, d_3 + d_4, d_4]
\end{aligned}$$

Eventually, it will be apparent that the following relationship can be established.

$$X_1=X_1'$$

$$X_2=X_6'$$

$$X_3=X_7'$$

$$X_4=X_8' \qquad \text{[Equation 10]}$$

Figure 7:
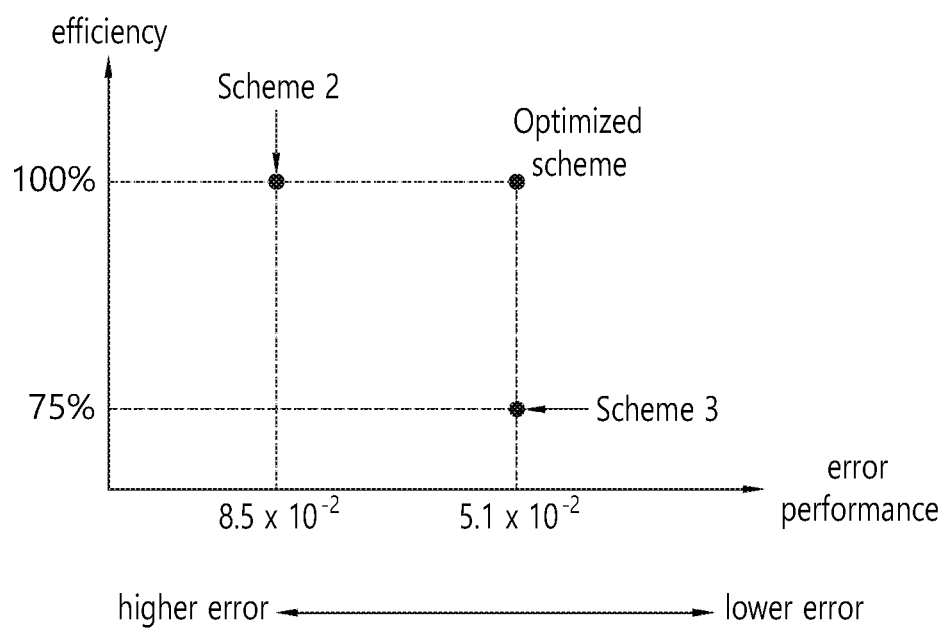
FIG. 7 is a graph showing a comparison between Method 2, Method 3, and an optimal method in light of performance and efficiency.

FIG. 7 is a graph showing a comparison between Method 2, Method 3, and an optimal method in light of performance and efficiency.

The results of the comparison between Method 2, Method 3, and the optimal method, which is proposed in this section, in light of performance and efficiency of the error likelihood are given as shown in FIG. 7.

2.2. An Optimal Transmission Method in a Case where the Mother Code has a Random Length Herein, the generator matrix of the mother code is referred to as matrix $G_{ñ}$ having a size of ñ×ñ, and the generator matrix of the code corresponding to the first packet, which is obtained by puncturing the generator matrix $G_{ñ}$ of the mother code, is referred to as matrix $G_n$ having a size of n×n. Hereinafter, the following sets will be described in detail as listed below.

$\Phi_{all}^{init}$: This indicates an index set of all rows of the generator matrix $G_n$ of a code being transmitted through the first packet. Generally, this is given as $\Phi_{all}^{init}=\{1, 2, \ldots, n\}$.

$\Phi_{all}$: This indicates a set indicating indexes of row belonging to that are $\Phi_{all}^{init}$ positioned within $G_{ñ}$. Generally, this is given as $\Phi_{all}=(ñ-n)+\Phi_{all}^{init}=\{(ñ-n)+1, (ñ-n)+2, \ldots, ñ\}$.

$\Phi_{zero}=[\phi_1^z, \ldots, \phi_{n_z}^z]$: This indicates a set of rows corresponding to the frozen bits among the rows belonging to $\Phi_{all}$.

$\Phi_{info}$: This indicates a set of rows corresponding to the information bits among the rows belonging to $\Phi_{all}$.

$\Phi_{info}'=[\phi_1', \ldots, \phi_{L'}']$: Among the information bits corresponding to the rows belonging to $\Phi_{info}$, this indicates a set of rows always being used in the second packet in order to transmit information bits when the information bits are allocated by using an optimal method.

$\Phi_{info}''=[\phi_1'', \ldots, \phi_{L''}'']$: Among the information bits corresponding to the rows belonging to $\Phi_{info}$, this indicates a set of rows that may not be used in the second packet in order to transmit information bits when the information bits are allocated by using an optimal method.

$\Psi=[\psi_1, \ldots, \psi_{\bar{L}}]$: In the viewpoint of the mother code, this indicates a set of rows corresponding to information bits having a bit error likelihood that is lower than or equal to the information bits corresponding to the rows belonging to $\Phi_{info}$.

For example, as shown in the example that is presented above, when assuming a case where a first packet having a length of 4 is configured from the length-8 mother code and 4 information bits are transmitted, the above-described sets are given as shown below.

$$\Phi_{all}^{init}=[1,2,3,4]$$

$$\Phi_{all}=(8-4)+\Phi_{all}^{init}=[5,6,7,8]$$

$$\Phi_{zero}=\emptyset$$

$$\Phi_{info}=[5,6,7,8]$$

$$\Phi_{info}'=[5]$$

$$\Phi_{info}''=[6,7,8]$$

$$\Psi=[4,5] \quad \text{[Equation 11]}$$

Figure 8:
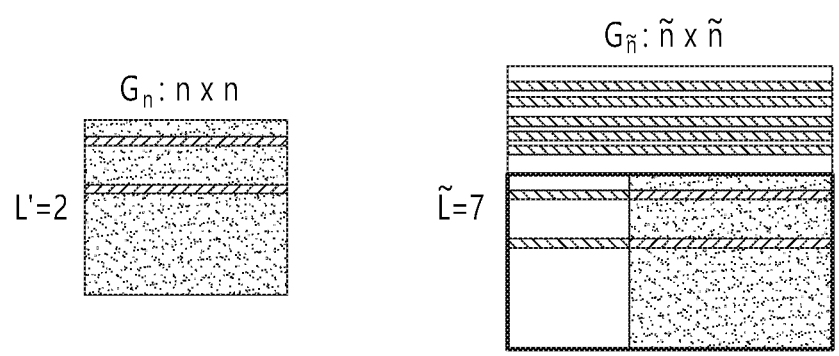
FIG. 8 illustrates an example of an optimal transmission method in case of a mother code having a random length (Step 1).

FIG. 8 illustrates an example of an optimal transmission method in case of a mother code having a random length (Step 1). More specifically, this diagram illustrates a set of rows that are selected from a generator matrix for a code corresponding to the first packet and a generator matrix for a mother code.

Figure 9:
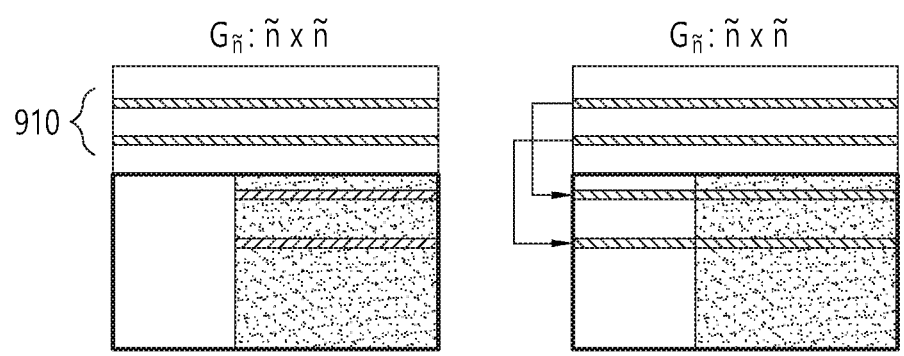
FIG. 9 illustrates an example of an optimal transmission method in case of a mother code having a random length (Step 2 and Step 3).

FIG. 9 illustrates an example of an optimal transmission method in case of a mother code having a random length (Step 2 and Step 3). More specifically, the diagram illustrates rows that are selected for a generator matrix for a mother code. And, herein, the selected rows are used to replace the rows of the generator matrix for the mother code.

Figure 10:
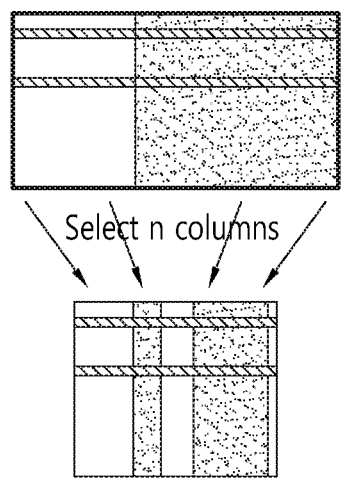
FIG. 10 illustrates an example of an optimal transmission method in case of a mother code having a random length (Step 4).

FIG. 10 illustrates an example of an optimal transmission method in case of a mother code having a random length (Step 4). More specifically, this diagram illustrates an example of creating a generator matrix having a size of n×n by selecting n number of columns from a generator matrix having a size of n×ñ according to an exemplary embodiment of the present invention.

Figure 11:
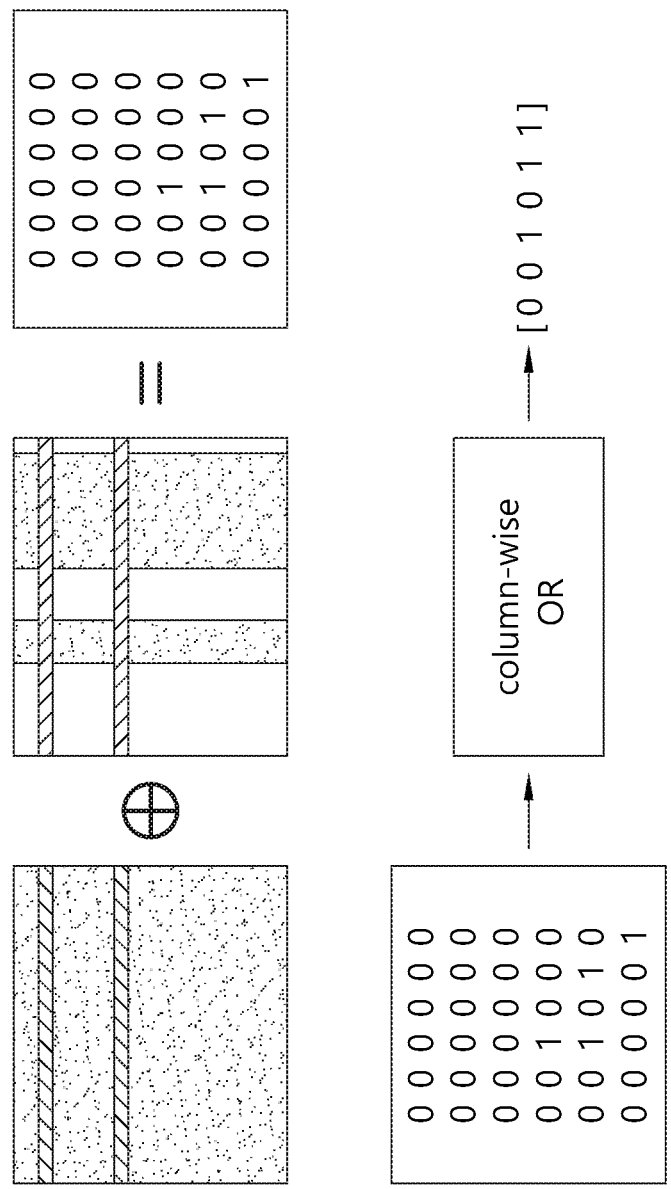
FIG. 11 illustrates an example of an optimal transmission method in case of a mother code having a random length (Step 5). This diagram illustrates an exemplary XOR operation between generator matrices and an exemplary OR operation for each column according to an exemplary embodiment of this specification.

FIG. 11 illustrates an example of an optimal transmission method in case of a mother code having a random length (Step 5). More specifically, this diagram illustrates an exemplary XOR operation between generator matrices and an exemplary OR operation for each column according to an exemplary embodiment of this specification.

Hereinafter, the optimal transmission method may be obtained as described below.

(Step 1): Sets are determined as $\Phi_{all}^{init}$, $\Phi_{all}$, $\Phi_{zero}$, $\Phi_{info}$, $\Phi_{info}'$, $\Phi_{info}''$, $\Psi$. 8, rows corresponding to $\Phi_{info}$ are indicated in the generator matrix $G_n$ for the code corresponding to the first packet, and rows corresponding to $\Psi$ are indicated in the generator matrix $G_{\tilde{n}}$ for the mother code. FIG. 11 shows an example, wherein a number of elements of $\Phi_{info}$ is given as L'=2, and wherein a number of elements of $\Psi$ is given as $\overline{L}$=7.

(Step 2): L' number of elements are selected from set $\Psi$ having $\overline{L}$ number of elements, and, then, the selected L' number of elements are aligned. Herein, a set of the selected L' number of specific elements that are aligned is indicated as $\mu$. In the left side drawing of FIG. 9, such selected rows are indicated by referential numeral 910.

(Step 3): The rows corresponding to the selected number of elements within the mother code are used to replace the rows corresponding to $\Phi_{info}'$. The right side drawing of FIG. 9 shows the replacement of such rows.

(Step 4): A generator matrix n×ñ is configured by selecting a last n column of the generator matrix, which is configured in (Step 3). Thereafter, only n number of columns are selected and aligned, thereby configuring a new generator matrix having the size of n×n. Herein, a set of the selected and aligned specific n number of columns is indicated as θ. FIG. 10 shows such column selection.

(Step 5): XOR operation is performed on each element of the generator matrix $G_n$ corresponding to the code of the initial first packet, which is used in (Step 1), and the n×n generator matrix, which is configured in (Step 4). Subsequently, an OR operation is performed for each column for the n×n matrix, which is obtained by the operation. As a result, a 1×n row is obtained, and this row is indicated as z. In the obtained row z, if an element corresponds to 0, a column corresponding to a position of the element indicates a received signal, which can be re-used in the first packet. And, if an element corresponds to 1, a column corresponding to a position of the element indicates a received signal, which cannot be re-used in the first packet. FIG. 11 illustrates this operation process.

(Step 6): The efficiency $\varepsilon^{(\mu,\theta)}$ is calculated by using the method shown below.

$$\varepsilon^{(\mu,\theta)} = \frac{n - \text{weight}(z)}{n} \times 100\% \quad \text{[Equation 12]}$$

Herein, weight(z) indicates a Hamming weight of a column vector z. FIG. 11 shows an example in which z=[0, 0, 1, 0, 1, 1]. In this example, it is given that weight(z)=3.

Additionally, an average error likelihood $P_b^{(\mu)}$ of bit channels for the information bits corresponding to set $\mu$. of the specific rows that are currently being used is calculated. Herein, since θ influences only the efficiency and does not influence the error likelihood of the average information bits, although the efficiency is indicated by a function of $\mu$. and θ, the average error likelihood is indicated only a function of $\mu$.

(Step 7): The process is returned to (Step 4), and then (Step 5) and (Step 6) are repeated for all possible cases of column selection. More specifically, (Step 5) and (Step 6) are repeated by considering all possible θ values, and the number of all possible θ values is given as $$\binom{\tilde{n}}{n} \times n!.$$

The average error likelihood is calculated with the given efficiency for the total number of possible cases of column selection, and specific θ values providing minimum likelihood at the same efficiency are calculated. Alternatively, a θ value providing maximum efficiency for the same error likelihood is calculated.

(Step 8): The process is returned to (Step 2), and then (Step 3) to (Step 7) are repeated for all possible cases of row selection. More specifically, (Step 3) to (Step 7) are repeated by considering all possible $\mu$. values, and the number of all possible $\mu$. values is given as $$\binom{\tilde{L}}{L'} \times L'!.$$

The average error likelihood is calculated with the given efficiency for the total number of possible cases of row selection, and specific μ. values providing minimum likelihood at the same efficiency are calculated. Alternatively, a μ. value providing maximum efficiency for the same error likelihood is calculated.

Figure 12:
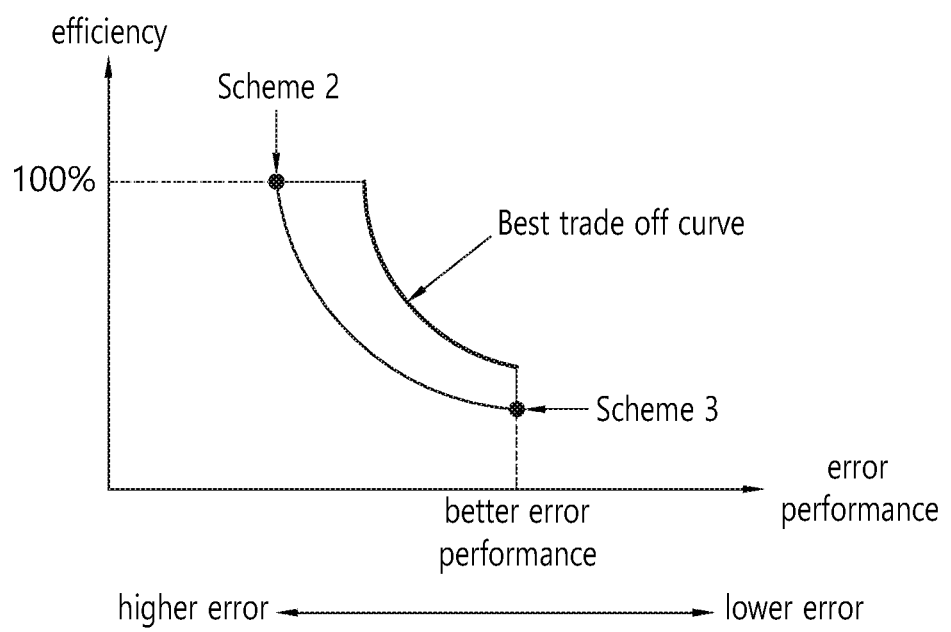
FIG. 12 is a graph showing a comparison between Method 2, Method 3, and an optimal method having an optimal tradeoff in light of performance and efficiency.

FIG. 12 is a graph showing a comparison between Method 2, Method 3, and an optimal method having an optimal tradeoff in light of performance and efficiency.

If an optimal transmission method is obtained by using the above-described method, a transmission method having a tradeoff such as a "best tradeoff curve" shown in FIG. 12 may be implemented.

2.3. A Suboptimal Transmission Method in a Case where the Mother Code has a Random Length The optimal transmission method that is developed in the above-described section provides an optimal tradeoff in light of error performance and efficiency. However, in order to obtain the methods corresponding to the points positioned on the optimal tradeoff curve, all likelihood of column selection (wherein the total number of cases corresponds to $$\binom{\hat{n}}{n} \times n!)$$

and all likelihood of row selection (wherein the total number of cases corresponds to $$\binom{\hat{L}}{L'} \times L'!)$$

should be considered. Such calculation of all possible cases is not required to be carried out in real-time. Accordingly, an optimal transmission method may be calculated in advance by using a sufficient amount of time and calculation. Thereafter, only the final transmission method may be stored in the system. Nevertheless, if the ñ, n, $\bar{L}$, L' values still remain insufficiently reduced (i.e., not small enough), there may still remain a large number of cases that need to be considered. And, eventually, due to a considerably high level of complexity, it may be difficult to actually perform all of the operations, even though the operations are not performed in real-time. In order to resolve such problems, methods having reduced level of complexity are proposed in the following section.

2.3.1. A Case where a Length of the Mother Code is Equal to Two Times the Length of the First Packet In this section, a case where the length of the mother code is two times the length of the first packet is considered, i.e., a case where ñ=2n is considered. This case corresponds to a very important case even in an actual transmission environment. This is because the length of the optimal polar code is equal to an exponential power of 2.

In the case where ñ=2n, the level of complexity for performing row selection may be reduced significantly. More specifically, an optimal θ may be obtained at a considerably low level of complexity. The essential idea of this method relates to calculating only a correlation between rows being replaced by other rows and the other rows that replace the existing rows within the generator matrices of the polar code, instead of calculating the efficiency by performing a comparison between two different matrices. The actual implementation may be achieved as described below.

Firstly, (Step 1) to (Step 3) are the same as the method proposed in the previous section. Thereafter, instead of comparing the two matrices, a correlation between selected rows that replace existing rows and the existing rows that are being replaced is calculated. For this (Step 4) is modified (or varied) as described below.

Figure 13:
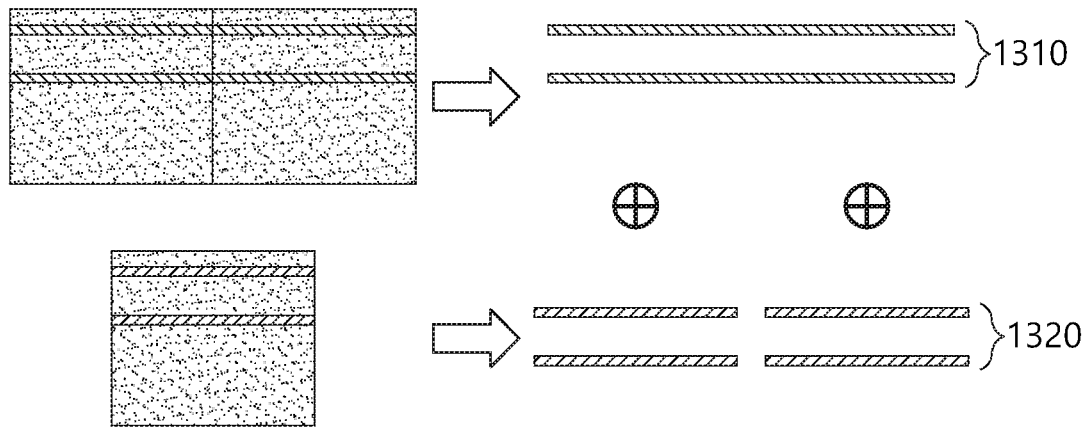
FIG. 13 illustrates an example of a suboptimal transmission method in case of a mother code having a random length (Step 4).

FIG. 13 illustrates an example of a suboptimal transmission method in case of a mother code having a random length (Step 4).

Figure 14:
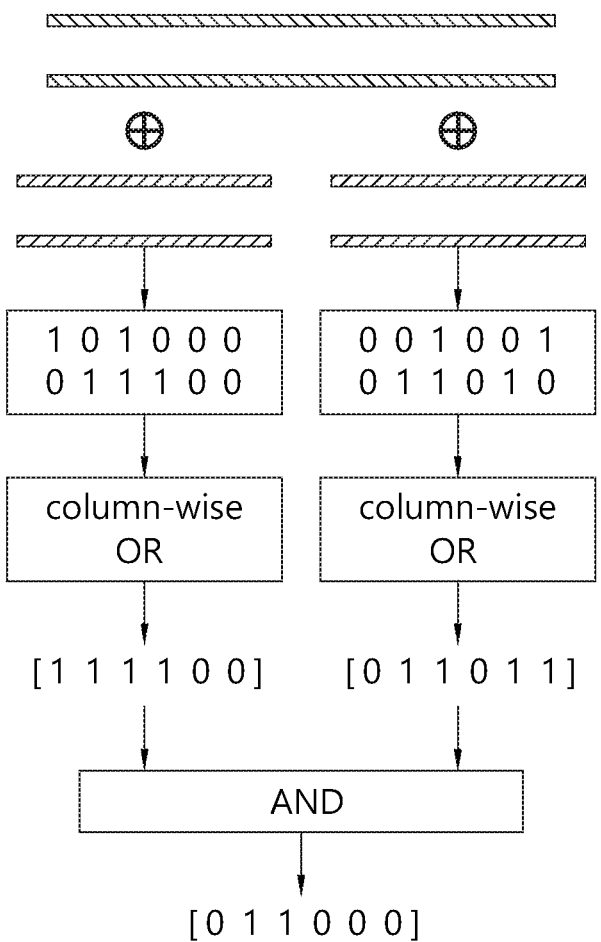
FIG. 14 illustrates an example of a suboptimal transmission method in case of a mother code having a random length (Step 5).

FIG. 14 illustrates an example of a suboptimal transmission method in case of a mother code having a random length (Step 5).

(Step 4): Rows that are to be replaced are separated from the generator matrix G of the first packet. This concept is shown in a lower part of FIG. 13. At this point, the separated rows are repeated two times, thereby creating rows having a length of 2n. These separated rows are indicated by referential numeral 1320. Additionally, in the generator matrix of the mother code, only the rows that are selected from Ψ are separated. This concept is shown in an upper part of FIG. 13. These separated rows are indicated by referential numeral 1310.

(Step 5): Firstly, an XOR operation is carried out for each element between the two groups of rows that are separated in (Step 4). Thereafter, an OR operation is carried out for each column. Finally, an AND operation is carried out between the two 1×n rows that are obtained. As a result, a 1×n row is obtained, if an element corresponds to 0, a column corresponding to a position of the element indicates a received signal, which can be re-used in the first packet. And, if an element corresponds to 1, a column corresponding to a position of the element indicates a received signal, which cannot be re-used in the first packet. FIG. 14 illustrates this operation process.

Subsequently, (Step 6) is the same as the above-described optimal method. However, this method does not require (Step 7), wherein repetitive operation is performed for all possible column selection. Accordingly, the level of complexity becomes significantly reduced at this point. (Step 8) is the same as the above-described optimal method.

2.3.2. A Method for Reducing a Level of Complexity in Row Selection

This section describes a suboptimal method for reducing the level of complexity that is related with row selection. In (Step 8) of the original optimal method, the process returns to (Step 2) so as to consider all number of cases for the selection of all possible $$\binom{\hat{L}}{L'} \times L'!$$

number of rows. However, in this case, since the level of complexity is generally excessively high, it may be difficult to actually implement this process step. In order to resolve such problems, operation is performed only for the row selection cases that are actually useful.

Figure 15:
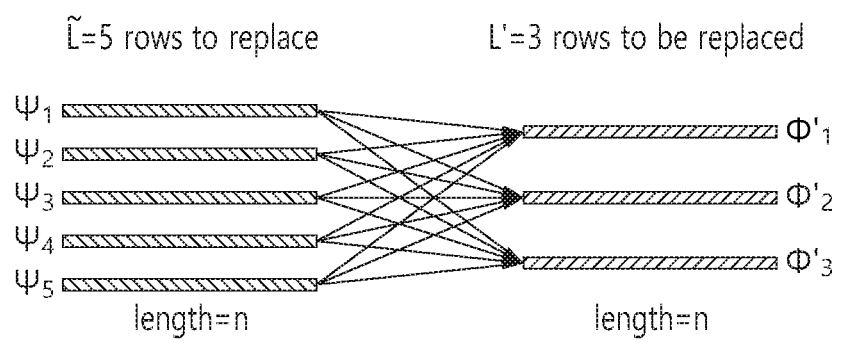
FIG. 15 illustrates an example of a suboptimal transmission method selecting 3 rows from 5 rows.

FIG. 15 illustrates an example of a suboptimal transmission method selecting 3 rows from 5 rows.

For example, as shown in FIG. 15, a case $\Psi$ where has 5 elements, i.e., 5 possible rows, and $\Phi_{info}'$ has 3 elements, i.e., 3 rows, is considered. In this case, the total number of possible row selections is given as $$\binom{5}{3} \times 3!.$$

Instead of performing operation for all cases, the amount of calculation may be sufficiently reduced by using a suboptimal method.

Figure 16:
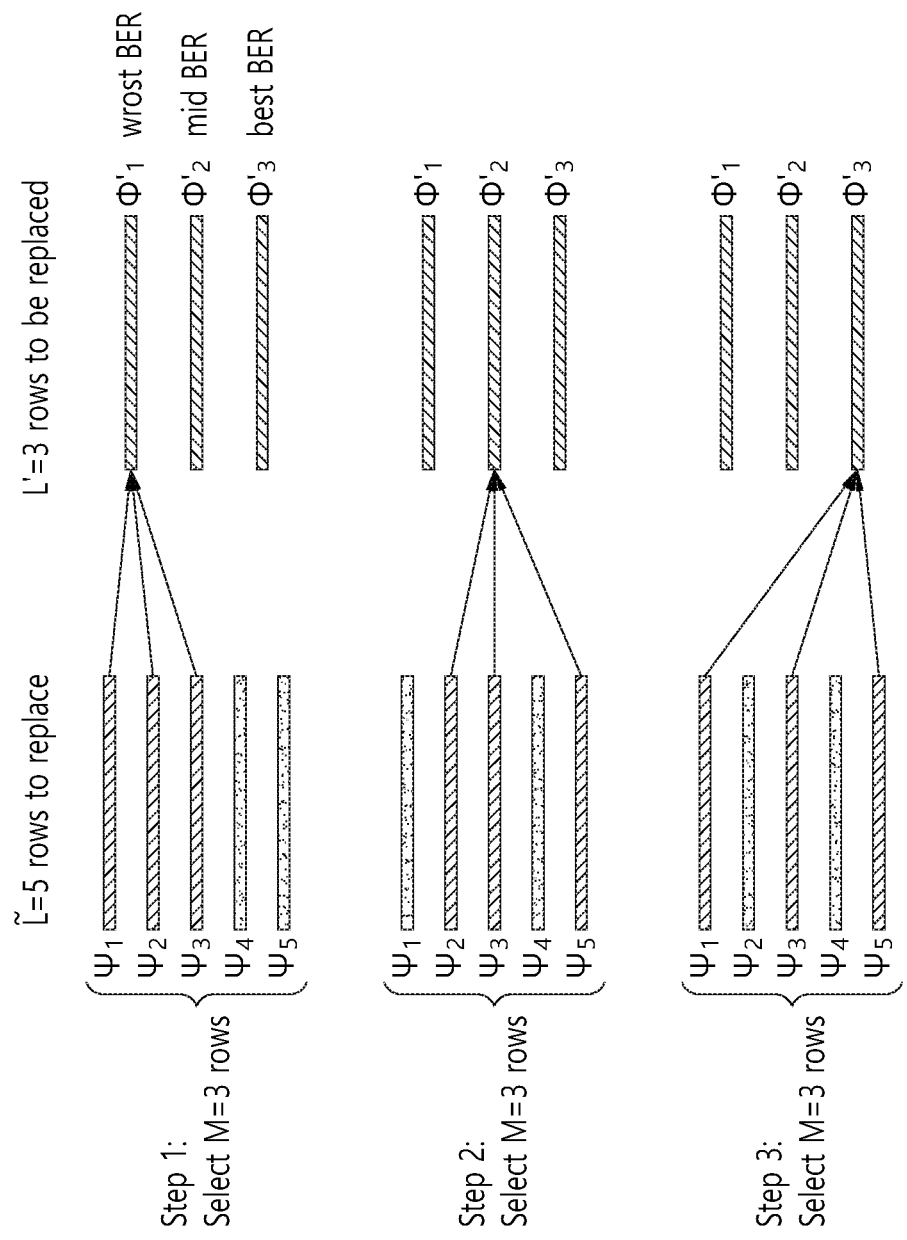
FIG. 16 illustrates an example of a suboptimal transmission method selecting 3 rows from 5 rows.

FIG. 16 illustrates an example of a suboptimal transmission method selecting 3 rows from 5 rows.

The method that is proposed in the present invention is shown in FIG. 16. Firstly, as shown in a right side drawing of FIG. 16, the rows belonging to $\Phi_{info}'$ are aligned in an increasing order starting from the poor bit channels corresponding to each row. Although this step is not a necessarily required step, by aligning the rows according to this method, the likelihood of performing a more advantageous (or favorable) row selection may be provided to the rows corresponding to the bit channels having more disadvantageous (or poorer) error likelihood. Thus, an overall enhancement in performance may be expected. The proposed method is operated as described below. Firstly, the total number of possible rows that can replace $\phi_1'$, which indicates a first row to which $\Phi_{info}'$ belongs, is equal to 5. However, instead of considering all of these rows, only a small number of rows having the highest correlation with row $\phi_1'$ will be considered herein. In FIG. 16, 3 rows are selected from $\Psi$. Thereafter, for each case of the selected $\phi_1'$, the total number of possible rows that can replace $\phi_2'$ is equal to 4. However, instead of considering all of these rows, once again, only a small number of rows will be considered herein. In FIG. 16, once again, 3 rows are selected from $\Psi$. By using this method, once again, only 3 rows will be considered as the number of possible rows that can replace $\phi_3'$.

Figure 17:
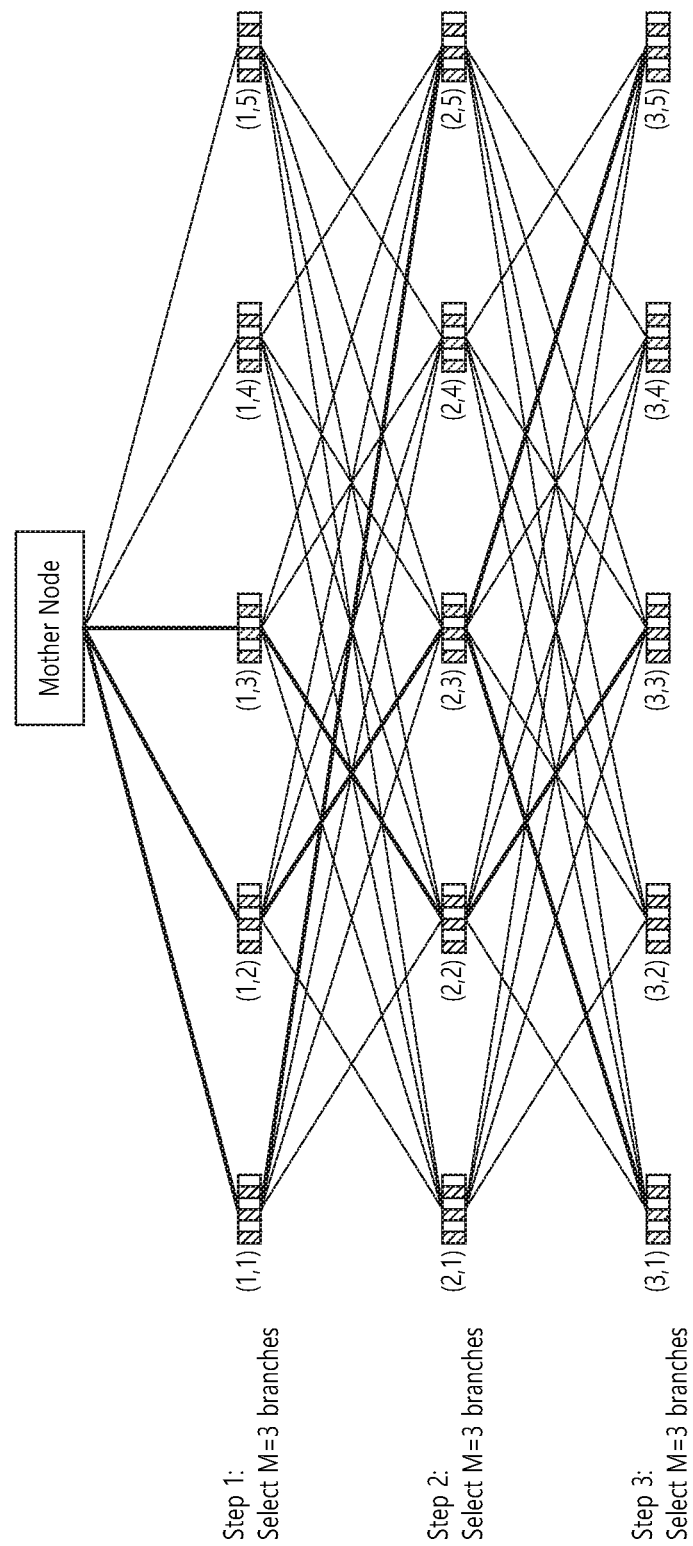
FIG. 17 illustrates an example of a suboptimal transmission method selecting 3 rows from 5 rows.

FIG. 17 illustrates an example of a suboptimal transmission method selecting 3 rows from 5 rows.

FIG. 17 shows the above-described suboptimal row selection method in a tree structure. In FIG. 17, a mother node indicates a correlation between two generator matrices excluding the rows belonging to $\Phi_{info}'$ and the rows belonging to $\Psi$. The tree structure of FIG. 17 corresponds to a matrix format having a size of 3×5 and having nodes distributed therein. Generally, the nodes are distributed in a matrix format having a size of L'×$\overline{L}$. Herein, a $(i, j)^{th}$ node indicates a correlation between an $i^{th}$ row belonging to $\Phi_{info}'$ and a $j^{th}$ row belonging to $\Psi$. A first step corresponds to a step of determining a row that replaces $\phi_1'$. At this point, all of the 5 possible cases are indicated as 5 possible branches. In the suboptimal method that is proposed in the present invention, only M=3 branches are selected instead of 5 branches. Listed below are several reference standards that can be used when selecting the M number of branches, as described above.

M number of branches having a maximum correlation between the rows are selected.

Among the rows having an average error likelihood that is less than or equal to a predetermined standard, M number of branches are selected in order to maximize the correlation between the rows.

M number of branches are selected in order to minimize the error likelihood.

M number of branches are selected in order to minimize the error likelihood while allowing the correlation between the rows to be equal to or greater than a predetermined standard.

In the second step, a total of 5×4=20 branches initially exist. However, not all of these branches are selected. Firstly, since 4 branches are connected to each of the M number of branches that are selected in the first step, the number of possible branches is equal to 4M=4×3=12. As described above, among the 12 branches, M=3 number of branches are once again selected. Such selection may be performed by using any one of the above-described several reference standards. Finally, in the third step, a total of 5×4×3=60 branches initially exist. However, not all of these branches are selected. Firstly, since 3 branches are connected to each of the M number of branches that are selected in the first step and the second step, the number of possible branches is equal to 3M=3×3=9. As described above, among the 9 branches, M=3 number of branches are once again selected.

Such selection may be performed by using any one of the above-described multiple reference standards. In this example, although it is described that the same M number of branches, wherein M=3, are selected in all of the process steps, in an actual application, a different number of branches may be selected. More specifically, in the $k^{th}$ step, $M_k$ number of branches may be selected.

2.3.3. A Method for Reducing a Level of Complexity in Column Selection

Figure 18:
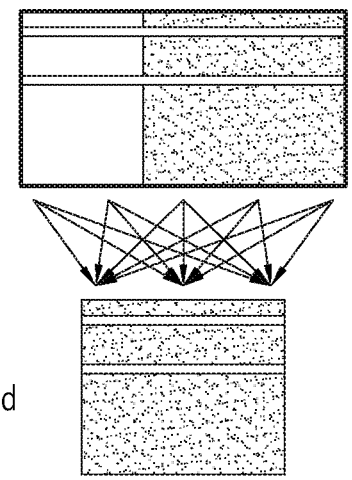
FIG. 18 illustrates an example of a suboptimal transmission method selecting n number of rows from ñ number of rows.

FIG. 18 illustrates an example of a suboptimal transmission method selecting n number of rows ñ from number of rows.

This section proposes a method for reducing the level of complexity that is related to column selection. FIG. 18 shows a case of selecting n number of rows from ñ number of rows. In order to efficiently perform such column selection, a tree structure diagram may be used just as in the previous section.

Figure 19:
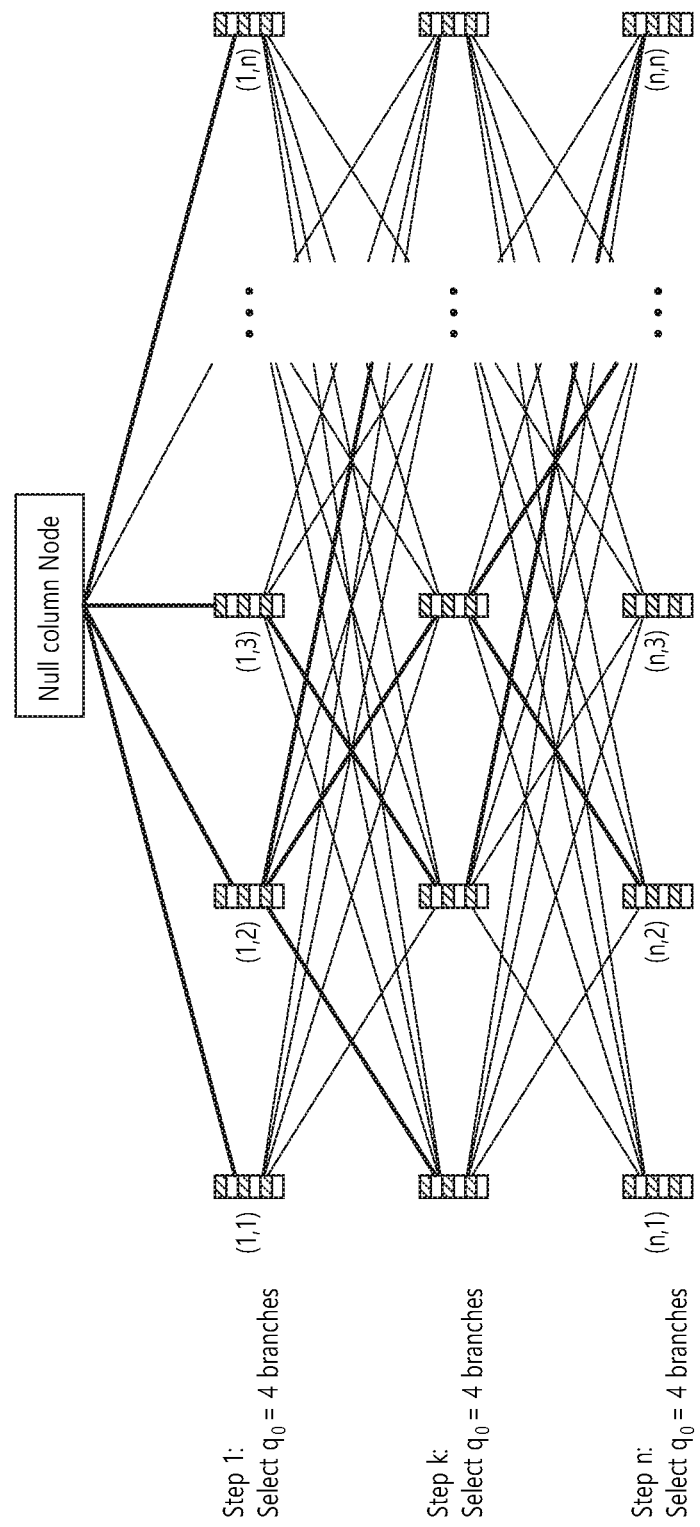
FIG. 19 illustrates a tree structure for efficiently selecting a column.

FIG. 19 illustrates a tree structure for efficiently selecting a column.

The tree structure for a column selection is shown in FIG. 19. The tree structure that is given in FIG. 19 corresponds to a structure having a size of n×ñ. A $(i, j)^{th}$ node indicates a correlation between an $i^{th}$ column of the generator matrix $G_n$ corresponding to the first packet and a $j^{th}$ column of a n×ñ sub-matrix, which is obtained by selecting a last n row of the generator matrix $G_ñ$ corresponding to the mother code. In a first step of the tree structure, ñ number of branches exist, and this indicates that one column is selected ñ from number of columns and that the selected one column is then mapped to a first column of a sub-packet. In a second step for each branch of the first step, ñ−1 number of branches exist, and, therefore, a total of ñ×(ñ−1) number of branches exist. By using the above-described method, in an $n^{th}$ step, a total of ñ×(ñ−1)×(ñ×(ñ−n+1) number of branches exist. This number of branches is indicated as $$\binom{ñ}{n} \times n!,$$

and the level of complexity in this case is generally considerably high. In order to reduce such high level of complexity, in each step, only M number of branches are selected. At this point, M number of branches having maximum correlation are selected in each step. More generally, different $M_k$ number of branches may be selected in each step.

2.3.4. A Method for Reducing a Level of Complexity when Row Selection and Column Selection are Performed Simultaneously In this section, a method for simultaneously performing row selection and column selection will be described by using a tree structure. The tree structure corresponds to a matrix format having a size of $L' \times \overline{L}$ and having nodes distributed therein. Herein, a $(i, j)^{th}$ node indicates a correlation between an $i^{th}$ row belonging to $\Psi_{info}'$ and a $j^{th}$ row belonging to $\Psi$. The above-described processes are the same as the tree structure of the method for reducing the level of complexity of a row selection. However, the tree structure in this section is different in that, instead of having nodes that are connected to one another by being connected to one branch, the nodes are connected to one another by being connected to a set including multiple branches. Herein, the multiple branches indicate multiple possible column selection. This concept is shown in FIG. 20.

Figure 20:
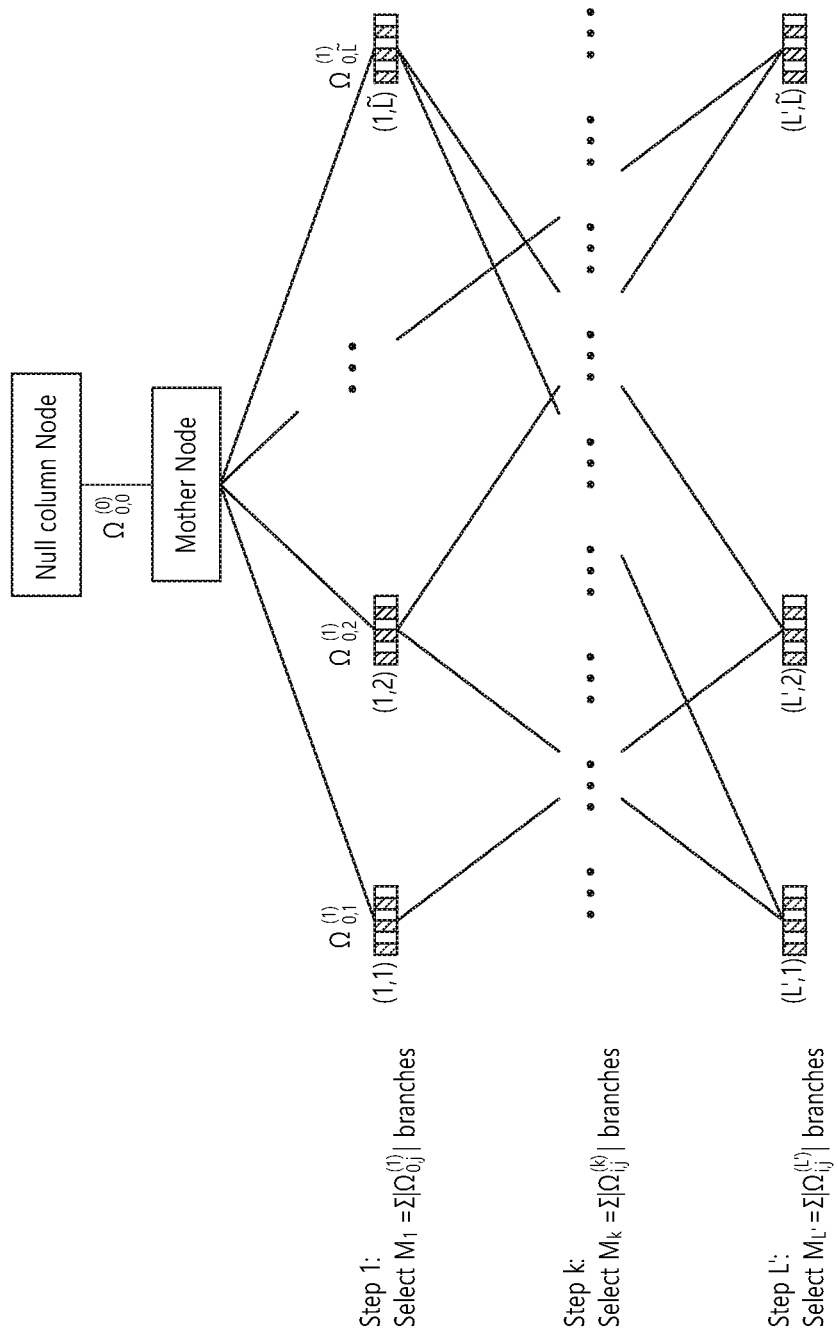
FIG. 20 illustrates a tree structure for efficiently selecting row and a column simultaneously.

FIG. 20 illustrates a tree structure for efficiently selecting row and a column simultaneously.

FIG. 20 shows a set of column selections being used at a part where a $(m, j)^{th}$ node and a $(m+1, j)^{th}$ node are connected. The same column selection should be used in each packet, which starts from an uppermost null row node and ends at a lowermost node. For this, the following condition must be satisfied.

$$\Omega_{i,j}^{(m)} \supseteq \Omega_{j,k}^{(m+1)}, \forall i,j,k,m \qquad \text{[Equation 13]}$$

In a $k^{th}$ step a total of $M_k = \Sigma_{i,j} |\Omega_{i,j}^{(k)}|$ branches are selected.

Section 3: Generalization of the Proposed Methods

3.1. The Generalized Method 2, Method 3, and Optimal Method

In the above-described sections, the essential idea of 'Method 2', ' 'Method 3', and the 'optimal method' is first to puncture the mother code, and, then, after obtaining a first packet, performing optimal information bit allocation in the viewpoint of the first packet. In the actual communication environment, the size of the first packet may be determined to be of any size as long as the first packet satisfies condition of including all of the information bits is satisfied. A method of implementing Method 2, Method 3, and the optimal method to achieve the best performance relates to considering all possible sizes of the first packet, locating in advance the positions of the optimal information bit allocation for each size, storing the located positions in a memory of the system, and using the stored positions when needed. Thus, when the system is implemented, a best performance may be achieved. However, in the actual system, due to the level of complexity, limitations in the memory, and so on, it may be difficult to store in advance the positions of the optimal information bit allocation for all of the possible sizes of the first packet. In this case, by considering in advance only the cases corresponding to specific sizes of the first packet (this does not refer to all possible cases), only the positions of optimal information bit allocation for the considered cases are stored in the memory. In this case, in the actual communication environment, in case the size of the first packet is determined to be equal to a random value, the system uses the optimal information bit allocation, which is stored for a packet having the most similar size as the randomly determined size of the first packet. In case the actual packet size and the size of the packet having its optimal information bit allocation stored in the system are different from one another, the best performance may not be achieved. However, if the difference in size is not significant, the performance degradation may not be significant. Furthermore, by using the above-described method, the level of complexity or the required size of the memory in the system may be reduced.

3.2. Case of a HARQ where the Mother Code is Punctured and Divided into Two or More Packets and then Transmitted In the above-described sections, for simplicity in the description, a HARQ, wherein the mother code is punctured and divided into two packets and then transmitted, was considered. Herein, a method having an optimal tradeoff between error likelihood and efficiency. This method may also be applied to a case of a HARQ, where the mother code is punctured and divided into two or more packets and then transmitted. In this case, the method proposed in the present invention may be applied between two packets that are transmitted while being adjacent to one another. For example, a case where the mother code is divided into 3 packets will be considered. In this case, an optimal transmission method may be developed by applying the method, which is developed in the previous section, between the first packet and the second packet. Thereafter, an optimal transmission method may be developed by applying the method, which is developed in the previous section, between the second packet and the third packet. By performing this method, in case the mother code is divided into a random N number of packets, by repeatedly using the method, which is proposed in the previous section, for N−1 number of times, an optimal transmission method may be proposed.

An overall method for performing HARQ by using a polar code having a random length may hereinafter be described in detail.

A transmitter generates a mother bit sequence having a size of M that is to be transmitted to a receiver. The mother bit sequence includes information bits that are intended to be transmitted to the receiver and frozen bits that are defined advance between the transmitter and the receiver.

The transmitter punctures a mother code so as to acquire a first input bit sequence having a random length of M. The transmitter calculates a mutual information size based on a likelihood distribution of a Log Likelihood Ratio (LLR) for the mother bit sequence, and, then, the transmitter may puncture the mother bit sequence so as to reduce any loss in the calculated mutual information size. At this point, the likelihood distribution of the LLR may be calculated by using Gaussian approximation. In this case, a ratio (i.e., transmission rate (or transfer rate)) between the information bits and frozen bits being included in the first bit sequence may be set up (or configured) by an indication signal, which is received in advance, or the corresponding ratio may be pre-configured in advance.

The transmitter determines the positions of the information bits and the frozen bits, so as to maximize the distribution of the channel capacity and/or mutual information size for the information bits and the frozen bits.

Thereafter, the transmitter generates the first input bit sequence to a first output bit sequence by a first encoder and transmits the generated first output bit sequence to the receiver. If a re-transmission request (i.e., NACK) is received from the receiver, the transmitter obtains a second input bit sequence from the mother bit sequence. Thereafter, the transmitter obtains a third input bit sequence that does not require any re-transmission from the obtained second input bit sequence. Finally, the transmitter generates the third input bit sequence to a second output bit sequence by a second encoder and transmits the generated second output bit sequence to the receiver.

Figure 21:
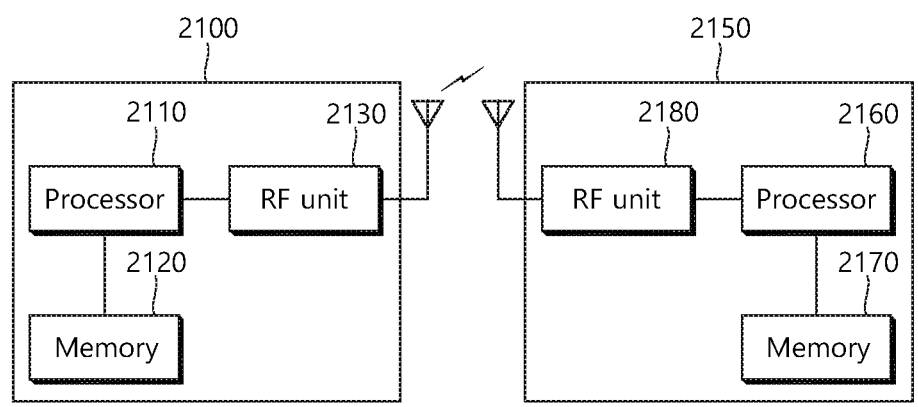
FIG. 21 is a block diagram illustrating a wireless communication system in which the present disclosure is implemented.

FIG. 21 is a block diagram illustrating a wireless communication system in which the present disclosure is implemented.

The transmitter (2100) includes a processor (2110), a memory (2120), and a radio frequency (RF) unit (2130). The memory (2120) is connected to the processor (2110) to store various information for driving the processor (2110). The RF unit (2130) is connected to the processor (2110) to transmit and/receive a wireless signal. The processor (2110) implements a suggested function, procedure, and/or method. An operation of the transmitter according to the above embodiment may be implemented by the processor (2110).

The receiver (2150) includes a processor (2160), a memory (2170), and an RF unit (2180). The memory (2170) is connected to the processor (2160) to store various information for driving the processor (2160). The RF unit (2180) is connected to the processor (2160) to transmit and/receive a wireless signal. The processor (2160) implements a suggested function, procedure, and/or method.

A processor may include an application-specific integrated circuit (ASIC), another chipset, a logic circuit, and/or a data processor. A memory may include read-only memory (ROM), random access memory (RAM), a flash memory, a memory card, a storage medium, and/or other storage devices. An RF unit may include a baseband circuit to process an RF signal. When the embodiment is implemented, the above scheme may be implemented by a module (procedure, function, and the like) to perform the above function. The module is stored in the memory and may be implemented by the processor. The memory may be located inside or outside the processor, and may be connected to the processor through various known means.

In the above exemplary system, although methods are described based on a flowchart including a series of steps or blocks, the present invention is limited to an order of the steps. Some steps may be generated in the order different from or simultaneously with the above other steps. Further, it is well known to those skilled in the art that the steps included in the flowchart are not exclusive but include other steps or one or more steps in the flowchart may be eliminated without exerting an influence on a scope of the present invention.

What is claimed is:

1. A method for performing a Hybrid Automatic Repeat reQuest (HARQ) based on a polar code, comprising:
    acquiring, by a transmitter, a plurality of first input bits being inputted to a first encoder from a plurality of mother bits having at least one information bit and at least one frozen bit;
    transmitting, by the transmitter to a receiver, a plurality of first output bits being generated from the first input bits by the first encoder;
    receiving, by the transmitter, a re-transmission request for the plurality of mother bits from the receiver;
    acquiring, by the transmitter, a plurality of second input bits being inputted to a second encoder from the plurality of mother bits;
    generating, by the transmitter, a plurality of second output bits being generated from the second input bits by the second encoder;
    selecting, by the transmitter, a plurality of third output bits from the plurality of second output bits; and
    transmitting, by the transmitter, the plurality of third output bits to the receiver,
    wherein the plurality of second input bits include at least one information bit being included in the plurality of first input bits, and
    wherein, among the plurality of second output bits, bits being encoded differently from the plurality of first input bits are preferentially selected as the third output bits.

2. The method of claim 1, wherein, within the plurality of first input bits, the information bit is positioned to a position having a better channel quality for the first encoder as compared to the frozen bit, and
    wherein, within the plurality of second input bits, the information bit is positioned to a position having a better channel quality for the second encoder as compared to the frozen bit.

3. The method of claim 1, wherein the first encoder generates the plurality of first output bits by performing exclusive OR (XOR) operation between the plurality of first input bits, and
    wherein the second encoder generates the plurality of second output bits by performing XOR operation between the plurality of second input bits.

4. The method of claim 3, wherein, among the plurality of second output bits, bits being processed with XOR operation that are different from the plurality of first output bits or bits being processed with a number of XOR operations that is different from the plurality of first output bits are preferentially selected as the plurality of third output bits.

5. The method of claim 4, wherein, among the plurality of second output bits, bits being processed with XOR operation that are the same as the plurality of first output bits and bits being processed with a number of XOR operations that is the same as the plurality of first output bits are preferentially excluded from being selected as the plurality of third output bits.

6. The method of claim 1, wherein the plurality of first input bits do not include the at least one frozen bit, and the plurality of second input bits include the at least one frozen bit.

7. The method of claim 1, wherein the first encoder performs encoding based on a first generator matrix, and the second encoder performs encoding based on a second generator matrix, and
    wherein the second generator matrix has a greater size than the first generator matrix.

8. The method of claim 7, wherein the first generator matrix and the second generator matrix are acquired by puncturing a same mother matrix.

9. The method of claim 7, wherein the second generator matrix corresponds to an 8 by 8 matrix, and the first generator matrix corresponds to a 4 by 4 matrix.

10. A device for performing a Hybrid Automatic Repeat request (HARQ) based on a polar code, comprising:
    a radio frequency (RF) unit transmitting and receiving radio signals; and
    a processor controlling the RF unit and including a first encoder and a second encoder, wherein the processor is configured to:

acquire a plurality of first input bits being inputted to a first encoder from a plurality of mother bits having at least one information bit and at least one frozen bit, transmit a plurality of first output bits being generated from the first input bits by the first encoder to a receiver, receive a re-transmission request for the plurality of mother bits from the receiver, acquire a plurality of second input bits being inputted to a second encoder from the plurality of mother bits, generate a plurality of second output bits being generated from the second input bits by the second encoder, select a plurality of third output bits from the plurality of second output bits, and transmit the plurality of third output bits to the receiver, wherein the plurality of second input bits include at least one information bit being included in the plurality of first input bits, and wherein, among the plurality of second output bits, bits being encoded differently from the plurality of first input bits are preferentially selected as the third output bits.

11. The device of claim 10, wherein, within the plurality of first input bits, the information bit is positioned to a position having a better channel quality for the first encoder as compared to the frozen bit, and wherein, within the plurality of second input bits, the information bit is positioned to a position having a better channel quality for the second encoder as compared to the frozen bit.

12. The device of claim 10, wherein the first encoder generates the plurality of first output bits by performing exclusive OR (XOR) operation between the plurality of first input bits, and wherein the second encoder generates the plurality of second output bits by performing XOR operation between the plurality of second input bits.

13. The device of claim 12, wherein, among the plurality of second output bits, bits being processed with XOR operation that are different from the plurality of first output bits or bits being processed with a number of XOR operations that is different from the plurality of first output bits are preferentially selected as the plurality of third output bits.

14. The device of claim 13, wherein, among the plurality of second output bits, bits being processed with XOR operation that are the same as the plurality of first output bits and bits being processed with a number of XOR operations that is the same as the plurality of first output bits are preferentially excluded from being selected as the plurality of third output bits.

15. The device of claim 10, wherein the plurality of first input bits do not include the at least one frozen bit, and the plurality of second input bits include the at least one frozen bit.

* * * * *